United States Patent [19]

Davidson

[11] 4,344,052
[45] Aug. 10, 1982

[54] DISTRIBUTED ARRAY OF JOSEPHSON DEVICES WITH COHERENCE

[75] Inventor: Arthur Davidson, Yorktown Heights, N.Y.

[73] Assignee: International Business Machines Corporation, Armonk, N.Y.

[21] Appl. No.: 191,603

[22] Filed: Sep. 29, 1980

[51] Int. Cl.³ .................... H01P 7/08; H01L 39/22
[52] U.S. Cl. .................... 333/222; 307/306; 330/4.6; 331/107 S; 333/247; 357/5; 343/792.5
[58] Field of Search .................... 357/5; 331/107 S; 307/277, 306, 462; 333/99 S, 218, 219, 222, 223, 247

[56] References Cited

U.S. PATENT DOCUMENTS

| | | | |
|---|---|---|---|
| 4,029,975 | 6/1977 | Zappe | 307/277 X |
| 4,039,856 | 8/1977 | Schlig | 357/5 X |

*Primary Examiner*—Paul L. Gensler
*Attorney, Agent, or Firm*—Jackson E. Stanland

[57] ABSTRACT

Josephson devices are distributed in series in a transmission line structure in which electromagnetic waves are used to synchronize the dynamics of the Josephson devices in order to achieve coherence between the devices. Electromagnetic waves, such as oscillatory traveling waves, standing waves, and solitary waves along the transmission line couple the Josephson devices in a manner such that coherence is achieved for the entire array. The Josephson devices can be tunnel junctions, point contacts, micro bridges, and weak links, and more generally include any such superconductive device which obeys the Josephson equations of voltage and current. The transmission line is any line which controllably supports electromagnetic waves, and can include strip lines located over a ground plane, coaxial lines, etc. A DC bias is supplied to the transmission line, and the ends are terminated in accordance with the type of wave to be propagated along the line. Each Josephson device couples to the electromagnetic wave along the transmission line where many Josephson devices can be in series. Typically, the Josephson devices are spaced closer than the wavelength of the electromagnetic wave, although this is not a necessity. The coherent array can be used for wave generation and detection, amplification, and as a voltage standard.

29 Claims, 13 Drawing Figures

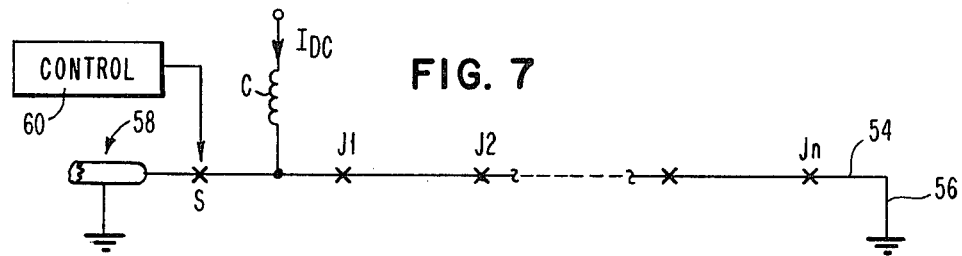
FIG. 7
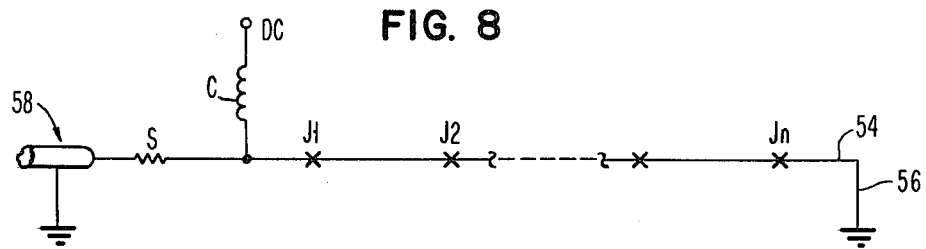
FIG. 8
FIG. 9
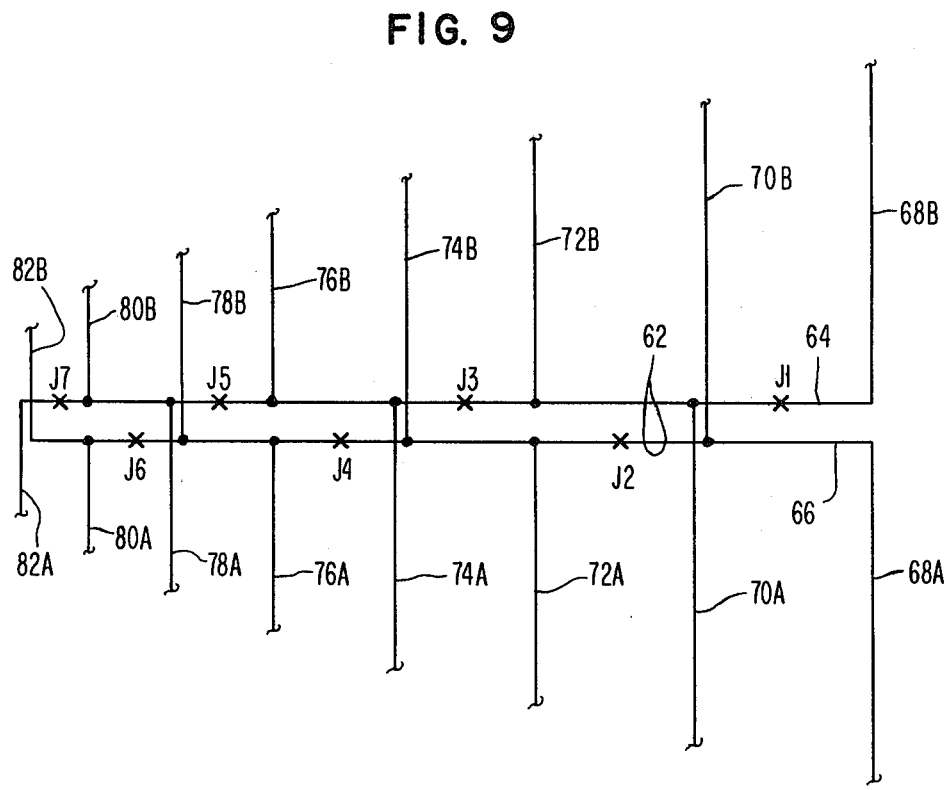

DISTRIBUTED ARRAY OF JOSEPHSON DEVICES WITH COHERENCE

TECHNICAL FIELD

This invention relates to distributed arrays of Josephson devices, and in particular to a distributed array in which coherence is obtained by coupling Josephson devices to electromagnetic waves.

BACKGROUND ART

For many applications, Josephson devices are extremely useful. These applications include use as voltage standards, parametric amplifiers, and millimeter wave generation and detection circuits and provide motivation for putting Josephson devices in series. All of these applications work better if the Josephson devices are coherent, i.e., if the Josephson devices have their oscillations coupled to achieve phase locking. In the prior art, it is known that coherence can be obtained if the Josephson devices in a series chain of the devices interact with one another as shown in K. K. Likharev, Reviews of Modern Physics, 51, 1 (1979). Unfortunately, Josephson devices in series arrays and fed by a current source do not interact electrically in the absence of shunt elements.

The prior art contains references to different efforts to achieve coherence in series arrays of Josephson tunnel junctions. These references have described the use of either close proximity between neighboring junctions, such as that taught in Mercereau et al, Applied Physics Letters 25, 18, 467 (1974) and J. E. Mercereau et al, J. Appl. Phys. 44, 4 (1973), or the use of shunting elements, such as resistors or inductors, connected between neighboring pairs of junctions as described in J. E. Lukens et al, IEEE Transactions on Magnetics, MAG-15, page 462 (January 1979); J. E. Lukens et al, AIP Conference Proceedings No. 44, page 327 (Charlottesville, 1978); and J. E. Lukens et al, AIP Conference Proceedings No. 44, page 298 (Charlottesville, 1978).

In the Mercereau et al references, junctions are placed very closely together in distances of the order of microns in order to achieve cooperation and interaction between neighboring junctions. The mechanism for interaction between neighboring junctions is a direct interaction type of mechanism in which quasi-particles from one junction travel to the adjacent junction. This structure is characterized by a characteristic length which is the quasi-particle diffusion length. This diffusion length is approximately one micron and for this reason the junctions are in very close proximity to one another in order to ensure that quasi-particles from one junction will be able to diffuse to the neighboring junction. If one junction in the series is an electrical short, the series chain of junctions will be broken because quasi-particles from one junction may not be able to diffuse the longer distance past the shorted junction to the next adjacent unshorted junction. In this structure, coupling depends upon each Josephson junction being coupled to the next Josephson junction and coherence depends upon maintaining the coupling in the entire chain of junctions. In addition to the problem which arises when one of the junctions is an electrical short, it is difficult from a fabrication standpoint to provide junctions as close as required by the quasi-particle diffusion length, and this puts additional constraints on the processing techniques which can be used.

Josephson junctions arranged in series with one another and having DC current through them do not normally interact with one another. That is, each junction will operate independently of the other junctions and there will be no cooperative effect. In order to make them interact, and hopefully in a coherent manner, the close proximity approach of Mercereau et al is one of the techniques that have been suggested in the prior art. Another technique is the use of shunting elements as described in the aforementioned references to Lukens et al.

In the Lukens technique, the shunting elements give a coupling between pairs of Josephson junctions by creating circuit loops that obey Kirchoff's law that the sum of the voltages around the loop is equal to zero. In this reference, the coupling elements bridge adjacent pairs of Josephson junctions and are not located between single adjacent junctions. The technique of Lukens et al is limited in the frequencies of the waves which can be generated or detected by the series array, the upper limit being approximately 30 GHz. Also, the size of the array is very much smaller than the characteristic length of the structure, which is the wavelength of oscillation of the Josephson junctions. This array cannot provide controlled coherence above approximately 30 GHz and no resonance phenomena is involved in the coupling of one junction to another junction. In Lukens et al, nearest neighbor coupling only is provided by the shunting elements, and it is not possible to couple other than nearest neighboring junctions. The Lukens structure of series connected Josephson junctions and shunting elements is small compared to the wavelength of interest, and is therefore difficult to fabricate. Furthermore, its high frequency limit is significantly less than that which would be most desirable.

The present invention overcomes these prior art problems and provides series connections of Josephson devices in which coherence is obtained. The technique for providing coherence is one which uses indirect coupling between the Josephson devices of the array in that each of the devices interacts with the total structure, and more particularly with an electromagnetic wave(s) which occupies the entire structure. The Josephson devices are series elements in a transmission line (i.e., a waveguide type structure) and coupling of the Josephson devices is obtained by the electromagnetic waves present along the transmission line. This series array can operate coherently at frequencies above 100 GHz, and may potentially develop micro watts or more of power in the submillimeter regime.

In contrast with the prior art techniques, the present technique does not use the proximity effect of closely spaced junctions and is therefore not limited to separations of Josephson devices within the quasi-particle diffusion length. Furthermore, the present technique is not limited in frequency and does not depend upon nearest neighbor coupling to provide coherence. The size of the entire array can be much greater than the characteristic length of interest, which in this case is the wavelength of the electromagnetic wave sustained along the line. Thus, even if some of the Josephson devices are electrical shorts, coherence will still be obtained in the array.

Accordingly, it is a primary object of the present invention to provide an improved technique and apparatus for achieving coherence in an array of devices which exhibit Josephson currents therethrough.

It is another object of the present invention to provide a coherent array of Josephson devices which will deliver substantial power at frequencies at least 100 GHz.

It is another object of the present invention to use electromagnetic waves to couple an array of Josephson devices in a manner to obtain coherence.

It is a further object of the present invention to provide a series array of Josephson devices exhibiting coherence, where the total length of the array is greater than the characteristic length of the array.

It is a still further object of the present invention to provide a series array of Josephson devices which exhibits coherence even if some of the Josephson devices do not operate properly.

It is another object of the present invention to provide a series array of Josephson devices which operates coherently without the need for nearest Josephson device interaction.

DISCLOSURE OF INVENTION

This invention is a series array of Josephson devices in which coherence is obtained by coupling each of the devices in the array to an electromagnetic wave. The Josephson devices are in series along a transmission line which can support an electromagnetic wave, such as a traveling wave, standing wave, or solitary wave. A DC current source is connected to one or both ends of the transmission line, and both ends of the line are terminated in accordance with the type of electromagnetic wave to be used. That is, both ends of the line have DC termination and AC termination. If a standing wave is to be used to couple the Josephson devices, the AC termination is one which provides a mismatch, such as an electrical short or an electrical open to the wave. A termination matched to the characteristic impedance of the transmission line will allow a traveling wave to exist on the line.

In this structure, the Josephson devices interact with the electromagnetic waves and are coupled to the structure comprising the transmission line and the Josephson devices. The transmission line provides the controllable wave guide structure which allows good coupling between the Josephson devices, via the structure itself. The electromagnetic waves are produced by the Josephson junctions when biased above their critical current $I_0$, or by a circuit external to the array which couples the waves to the array.

The Josephson devices of this invention are any devices which will follow the Josephson equations for current and voltage through the device. These devices include point contacts, micro bridges, weak links, and tunnel junctions. Thus, the Josephson devices are those which exhibit oscillatory current and voltage.

The transmission line which series connects the Josephson devices broadly provides a controllable waveguide structure, and includes coplanar lines, coaxial lines, and strip lines located over a ground plane. The transmission line is characterized by specific modes, a well defined characteristic impedance and propagation constant, and propagates energy in a certain way. In this regard, it differs from a current carrying conductor where control of the wave properties is much more limited.

These and other objects, features, and advantages will be more apparent from the following more particular description of the preferred embodiments.

BRIEF DESCRIPTION OF THE DRAWINGS

FIG. 1 is a top view of a series array of Josephson devices schematically shown in a strip line waveguide structure, while

FIGS. 7 and 8 show two structures for providing a cavity for building of resonance modes in a series connection of Josephson devices, illustrating continuous wave or pulsed operation of stimulated emission oscillators comprising a series array of Josephson devices.

FIG. 9 shows an antenna comprising a log-periodic array driven by coherent Josephson devices. Here, the Josephson array oscillator is part of the antenna and provides a technique for getting power out of the antenna.

FIG. 12 illustrates a structure which can be used to provide a voltage standard, comprising the coherent array of series connected Josephson devices described previously, while

BEST MODE FOR CARRYING OUT THE INVENTION

The technique of this invention uses electromagnetic waves to couple Josephson devices connected in series along a transmission line. Rather than relying upon very close spacing of the Josephson devices (i.e., nearest neighbor interaction) or shunt-connected elements to electrically couple pairs of Josephson devices, the present invention provides a structure in which each of the Josephson devices interacts with an electromagnetic wave and thereby with the transmission line structure. In this manner, there is an indirect coupling between the Josephson devices in the series array and coherence is obtained regardless of whether or not all of the Josephson devices operate properly.

Figure 1:
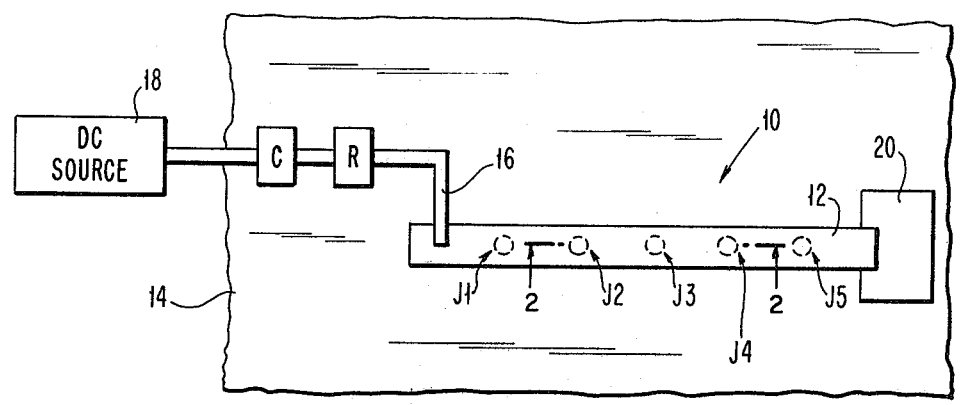

FIG. 1 shows a top view of a series connection of Josephson devices arranged in series along a strip line transmission line. In more detail, the Josephson devices are represented by the dashed circles J1-J5, while the strip line array 10 is comprised of a conductor 12 located over and insulated from a ground plane 14. One end of conductor 12 is connected electrically to a current carrying conductor 16 having a resistance R and a choke C in a series connection going to a DC current source 18. The other end of the strip line is electrically connected, via pad 20, to ground plane 14. The function of the choke is to keep high frequency oscillations from leaking back to the source 18, while the resistor R is used to control the amount of current sent to the strip line array 10. Depending upon the AC terminations of the strip line, traveling waves, standing waves, or solitary waves can be created along the length of the strip line 12 for causing coupling between Josephson device J1-J5.

As mentioned previously, Josephson devices J1-J5 can be any devices which will obey the Josephson equations $$V = \frac{\phi_0}{2\pi} \frac{d\phi}{dt} \quad I = \sin\theta \tag{1}$$

Here, the voltage V is related to the flux quantum $\phi_0$ and depends upon the time rate of change of the flux or phase $\phi$. The current I is related to the angle $\phi$ between the two wave functions characterizing the Josephson device. These are known expressions, and the Josephson devices can be, for example, weak links, tunnel junctions, point contacts, micro bridges, etc., or combinations thereof.

The transmission line used to series connect the Josephson devices is typically a waveguide structure which provides a controllable guide for electromagnetic waves. Examples of such a waveguide include a micro strip line of the type shown in FIG. 1, a coaxial line, or a planar arrangement of two parallel conductors.

Figure 2:
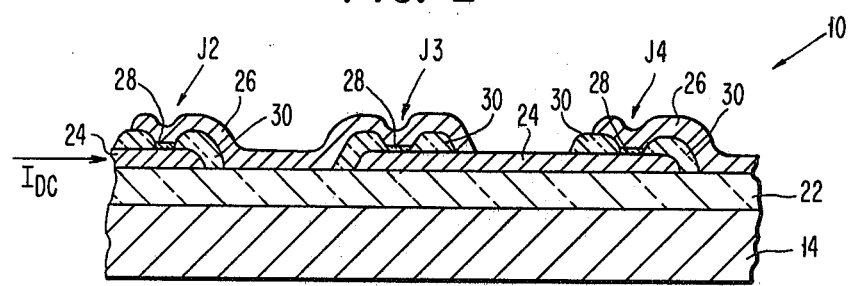
FIG. 2 is a side cross section view of a portion of the series array of FIG. 1.

FIG. 2 is a side view of the structure of FIG. 1, taken along the line 2—2. The size of the elements of FIG. 2 are enlarged with respect to FIG. 1, in order to illustrate the construction detail more easily. In FIG. 2, the Josephson devices J2, J3, and J4 are tunnel junctions comprising two electrodes separated by a thin tunnel barrier. The ground plane 14 has a layer of electrical insulation 22 located thereover. On this is deposited a superconductor 24, which is one electrode of the junctions J2, J3, and J4. The other electrode of the Josephson devices is the superconductor layer 26. Superconductors 24 and 26 also comprise the conductor 12 which connects the Josephson devices J1-J5 in series. A thin tunnel barrier 28 is formed between the electrodes of each of the tunnel junctions J2-J4. An electrically insulating layer 30 is used to prevent the electrodes from being shorted to one another.

It is assumed that the DC current $I_{DC}$ enters the base electrode of J2, so that it will tunnel through thin barrier layer 28 into counter electrode 26. This current will then travel through superconductor layer 26 to device J3. It will tunnel through the thin barrier layer 28 of J3 and again enter superconductor layer 24 thereof. It will then propagate to Josephson device J4, where it will tunnel through barrier 28 into electrode layer 26.

Josephson tunnel devices of the type shown in FIG. 2 are well known in the art, and can be comprised of various superconductors, such as lead and niobium, or alloys thereof. The insulating layer 22 is typically comprised of an oxide of the ground plane 14. If the ground plane is niobium, layer 22 is usually an anodized oxide layer thereof. The insulating layers 30 can also be oxides which are sputtered onto the superconductor layer 24.

Figure 3:
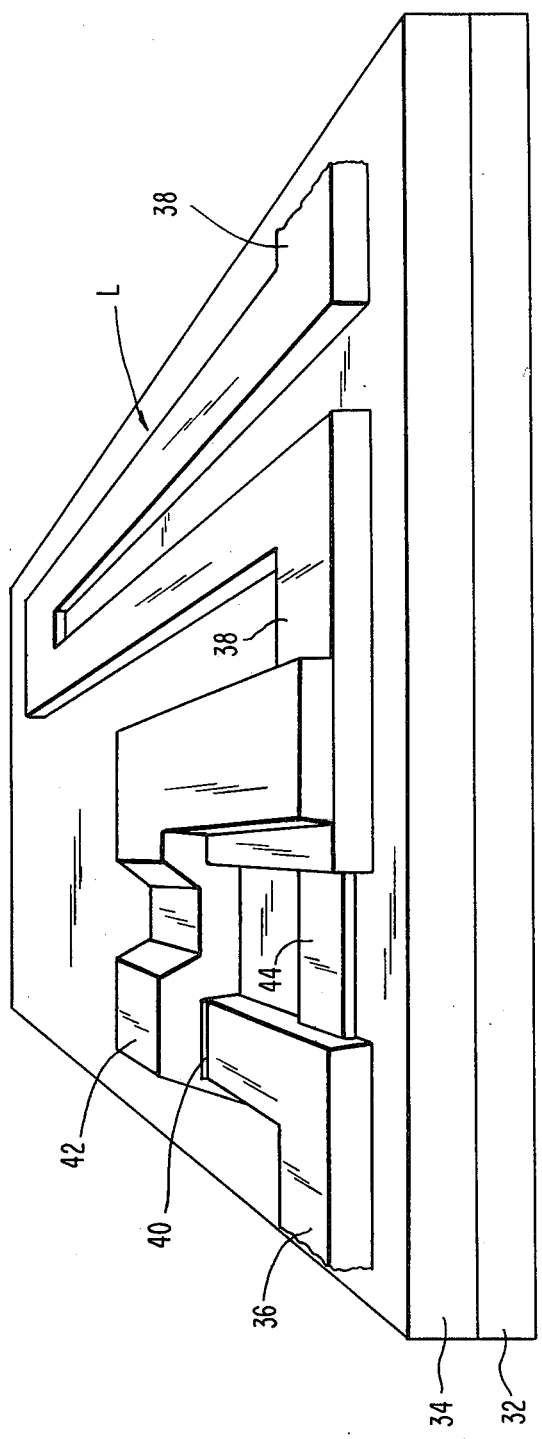
FIG. 3 is a perspective view of one segment of a transmission line having Josephson devices connected in series therein, showing a single Josephson device of the line and a transmission line forming a single loop comprising an inductor between adjacent superconductive Josephson devices.

FIG. 3 is a perspective view of one segment of a series array, which would be repeated in order to provide a plurality of Josephson devices serially connected in the array. The structure of FIG. 3 differs from that of FIG. 2 in that the insulating layer 30 is not needed to provide insulation between the base and counter electrodes of the Josephson devices. In FIG. 3, the counter electrode material is deposited directly over the tunnel barrier of the Josephson device and then connected to the transmission line.

In more detail, a superconducting ground plane 32 has an insulating layer 34 thereover, in the manner shown in FIG. 2. A superconductive base electrode 36 is then deposited in the same deposition step as is the transmission line 38. Thus, the base electrode 36 and the transmission line 38 can be comprised of the same material. A thin tunneling barrier 40 is then provided by, for example, oxidizing a portion of base electrode 36. After this, counter electrode 42 is deposited over tunnel barrier 40 and in a manner to make electrical contact to transmission line 38. Transmission line 38 has a single turn loop L therein to provide inductance along the transmission line. This enables the designer to achieve the required inductance without making the line too long. Further, a resistor 44 is fabricated in parallel across the base and counter electrode in order to adjust the resistance of each segment of the series array. In the mathematical treatment to be explained later, the values of the resistance and inductance will be described.

Figure 4:
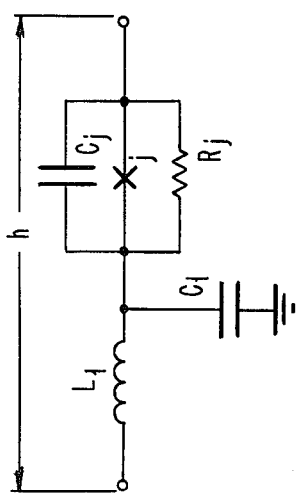
FIG. 4 is a schematic diagram of an equivalent circuit representing one segment of the transmission line structure, using lumped circuit elements to represent the segment, where $R_j$ and $C_j$ are the resistance and capacitance of the Josephson device, and $L_1$ and $C_1$ represent the inductance and capacitance, respectively, of the transmission line connecting adjacent Josephson devices. The distance h is the distance between adjacent Josephson devices.
Figure 5:
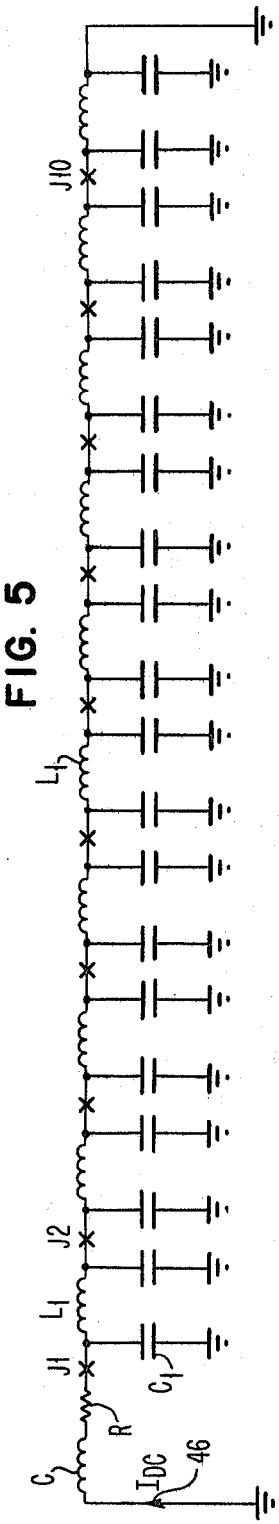
FIG. 5 is an equivalent circuit representation of a transmission line oscillator comprising a plurality of Josephson devices.

Mathematical Analysis (FIGS. 4 and 5)

Experimental data leads to the conclusion that the electrodynamics of this series array give rise to the coherent effects that are observed. Oscillatory traveling waves, solitary waves, and standing waves are all possible on these series arrays, and the presence of these waves leads to the coherence effects that are observed. In the analysis, it is possible to provide a lumped circuit model of each segment of the transmission line, which includes a single Josephson device and a portion of the transmission line. FIGS. 4 and 5 represent these lumped circuit models.

FIG. 4 shows a lumped model of one segment of a transmission line structure including series connected Josephson devices. The transmission line has a characteristic impedance Z and a phase velocity $v_1$. The distance h is the distance between each of the Josephson devices J. The Josephson device has a critical current $i_0$, a shunt resistance $R_j$, and a shunt capacitance $C_j$. If the wavelengths of interest are large compared to h, the model of FIG. 4 provides an accurate representation.

FIG. 5 represents the equivalent circuit of a transmission line oscillator having a plurality of Josephson devices in series. A current source 46 provides DC current $I_{DC}$ to the array through the choke C and resistance R. The inductance of the transmission line is $L_1$, while the capacitance of the line is $C_1$. In FIG. 5, ten Josephson devices J1-J10 are shown, but the FIG. does not include the Josephson capacitance $C_j$ and Josephson resistance $R_j$, for ease of illustration.

A set of finite difference equations governing a series array of the elements shown in FIG. 4 may be developed using standard techniques. In the long wave limit, the finite difference equations may be reduced to the following pair of coupled differential equations:

$$I_{xx} - \frac{1}{v_1^2} I_{tt} = \frac{1}{v_2^2} P_{tt} \quad (2)$$

$$I = \sin P + \frac{L_j}{R_j} P_t + L_j C_j P_{tt}, \quad (3)$$

where $L_j = \frac{\phi_0}{2\pi i_0}$, $v_2^2 = h v_1 \frac{Z}{L_j}$.

$\phi_0$ is the fluxoid quantum, 2.07 femto Webers. The current I has been normalized to $i_0$. Also, P(x,t) is the quantum phase difference across the junction at position x at time t. Where x and t are used as subscripts, they denote differentiation in space and time respectively. Equations 2 and 3 are distinct from the sin e-Gordon equation, which describes waves on a transmission line with shunt Josephson elements.

Equation 3 is the usual equation of motion for an isolated Josephson junction. Hence, each junction in the array is coupled to a wave equation through Equation 2, with $v_2$ playing the role of a coupling constant: if $v_2$ gets very large (a large critical current) the coupling disappears, and the junctions no longer interact.

The form of Equations 2 and 3 is in one-to-one correspondence with some simple equations familiar in non-linear optics. We need only identify I with the electric field E, and P with polarization (instead of phase) to obtain the equations describing electromagnetic plane waves propagating in a medium with a non-linear polarizability. The non-linearity, sin P, is strong; if I is greater than one no power series expansion is adequate. As in other Josephson analysis, a Bessel expansion is then required.

The coupling between the two equations can also be strong. This coupling is measured by the ratio $v_1^2/v_2^2$. It is technologically feasible to make this ratio the order of one for critical currents in the tens of microamperes, junction spacing of 100 microns, and frequencies in the millimeter to submillimeter range.

The phase velocities $v_1$ and $v_2$ are adjusted by controlling the ratio $L_j/L_1$. $L_1$ can be adjusted by adjusting the distance between the Josephson devices, and for this reason distance h is usually less than the wavelength of interest. Of course, shunt elements external to the strip line can also be used. The Josephson inductance $L_j$ depends upon the critical current $i_0$ and this can be controlled by fabrication and materials that are used for the Josephson devices. It should be noted that electromagnetic wave coupling will occur even if h is greater than the wavelength of interest; however, the equations described here are for the case where h is less than the wavelength of interest.

Experimental Results

An experimental 10 Josephson device array was fabricated in a small section of a chip on which other Josephson circuits were located. The array consisted of ten Josephson tunnel junctions connected in series by strip lines over a ground plane, in a manner similar to that described with respect to FIGS. 1 and 2. The line had a characteristic impedance Z=11.5 ohms, and the phase velocity was 79 microns per picosecond. The tunnel junctions were nominally 2.5 microns in diameter and were spaced every 131 microns. The array was shorted to ground at one end, and effectively open at the other end, to form a quarter wave resonator.

The current-voltage characteristics measured for the array indicate that coherence effects are obtained, rather than being due to individual junctions switching. The features of the current-voltage curve make it possible to interpret these features as being due to resonances involving the entire array. The voltage across each junction is a tenth of that measured for the array, so that the Josephson frequency of each junction was of the order of 100 GHz. This is within the frequency range that would be associated with a quarter wave resonator having the stated transmission line parameters. Thus, Josephson tunnel junctions in the voltage state are able to generate and propagate waves, the individual junctions coupled to the waves providing coherence across the entire array.

Simulation

A ten junction array with parameters matching those of the experiment described above was simulated on a digital computer. The algorithm was an iterative integration of Equations 2 and 3 with appropriate boundary conditions. The simulated current-voltage curve is similar to that obtained in the experiment. $R_j$ was taken as 5.5 ohms, consistent with the measurement, and $C_j$ was adjusted for the best fit, at about 0.4 picofarads.

In the simulation, it was feasible to monitor the current through each junction in the array so that standing waves might be detected. It was found that each step on the current-voltage curve had a corresponding standing wave pattern, with successive steps each adding a node. The amplitude of the standing waves is not small, in one case having a peak-to-peak current amplitude more than four times the critical current. Since the I-V curve is in good agreement with that actually measured, and since the same simulation shows a high amplitude standing wave whose wave number is in a one-to-one relationship to features on the I-V curve, there is good evidence of strong electromagnetic coupling between series tunnel junctions imbedded in a strip line.

This simulation was for the specific parameters of the fabricated array used in the experiment. Simulations with somewhat different parameters produced even larger standing waves, which remained large even when the critical currents of the individual junctions were allowed to vary. In one simulation, over 20 nanowatts were delivered to a 100 ohm load at 200 GHz, with 12 junctions in a half wave resonant line, having critical current variations of ±10%.

The relevance of the standing wave concept to series arrays has been strongly established and other waves, such as oscillatory and solitary traveling wave solutions to Equations 2 and 3, can also be obtained. For the oscillatory traveling wave, Equations 2 and 3 can be normalized so that time is in units of the reciprocal plasma frequency $1/\omega_P = \sqrt{(\phi_0 C_j/2\pi i_0)}$, and displacement is in units $v_1/\omega_P$. In the analysis, a reference frame is adopted traveling at the velocity expected for the traveling wave, $u = \omega/k$, where $\omega$ is a normalized frequency and k is a normalized wave vector. The traveling wave will then be described by a new variable $q = \omega t - kx$.

Writing Equations 2 and 3 normalized and then in the described reference frame, expressions for the current I can be obtained. An approximate solution to these equations is the following:

$$P = P_0 + q + a_1 \sin q. \quad (4)$$

Using a Bessel expansion of sin P for small $a_1$, a dispersion relation $\omega^2 = g + k^2$ is then obtained. Equation 4 represents an oscillatory traveling wave obeying the dispersion relationship.

Solitary Waves

A solitary wave is a localized transition between two states, propagating uniformly along the line. A solitary wave can exist on the series arrays described herein in the case where the Josephson devices are in their zero voltage state. Using Equations 2 and 3, and assuming that there is a zero average applied current, zero average voltage, and negligible damping, an equation of motion can be derived for which a solution is a stable solitary wave.

The solitary wave solution was simulated in a digital computer using a 51 tunnel junction series array that was set up with the same parameters. Simulation established the existence of the solitary wave solution.

Standing Waves

In the small signal limits, standing waves are a superposition of two oscillatory waves traveling in opposite directions. A finite array of Josephson junctions can be terminated at each end in some kind of a mismatch, such as an open or a short, so that reflections will occur. If there is sufficient bias current to ensure that all the junctions are in the voltage state, the junctions will oscillate and produce an oscillatory traveling wave which will build into a standing wave, where the phase of each junction in the array is synchronized with the phases of all the other junctions. In a physical picture, this situation is similar to that of classical laser theory: a standing wave synchronizes an array of oscillators dispersed in the medium that supports the standing wave.

A standing wave of the form $P = P_0 + \omega t + a_1 \cos kx \sin \omega t$ can be shown to be a self-consistent solution of Equations 2 and 3, at least for small $a_1$. This expression is a superposition of two traveling waves moving in opposite directions. A standing wave of this form obeys the same dispersion relation described in the context of traveling waves.

Figure 6:
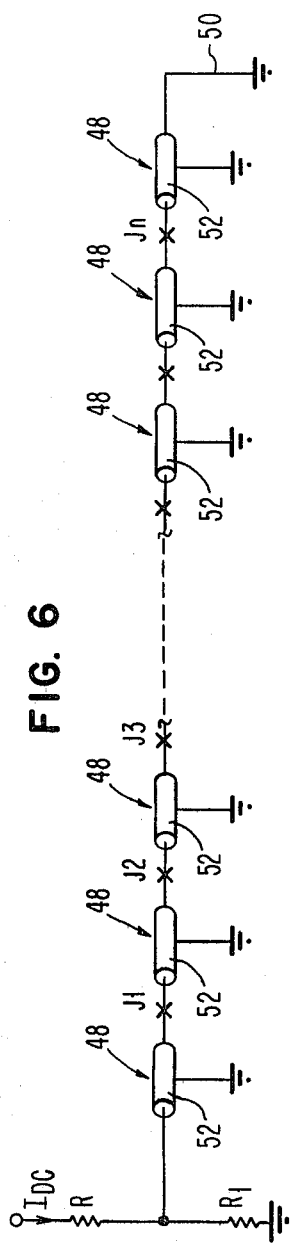
FIG. 6 is a schematic representation of a coaxial transmission line having a plurality of Josephson devices connected in series therealong.

Coaxial Line Embodiment (FIG. 6)

FIG. 6 shows an embodiment in which the transmission line interconnecting Josephson devices J1, J2, J3, ..., JN is a coaxial line. DC current $I_{DC}$ is provided from a source (not shown) through a resistor R. If necessary, a choke can be connected in series with resistance R, in the manner described with respect to FIG. 1. The transmission line segments 48 are coaxial lines where the Josephson devices are interconnected by the inner conductor 50 while the outer shield 52 of the coax is grounded. A large resistor R1 is connected to ground at the current source input while the other end of the transmission line is connected to ground. Thus, the array forms a quarter wave resonator.

The spacing between the Josephson devices J1-JN can be either periodic, log-periodic, or any other type of spacing. As mentioned previously, the spacing is typically less than the wavelength of interest if the mathematical relationships used herein are to be followed.

Continuous Wave and Pulsed Operation (FIGS. 7 and 8)

Continuous wave or pulsed operation of stimulated emission Josephson oscillators is possible in this series array. If the Josephson devices are biased above their critical current, they will emit stimulated radiation. These stimulated emission properties can be used in a traveling wave type of amplifier and can also be used to make an oscillator if the transmission line is configured as a cavity.

In more detail, the structure of FIGS. 7 and 8 provides a cavity comprising the transmission line schematically shown as line 54 interconnecting the Josephson devices J1, J2, ..., JN. A DC current $I_{DC}$ is provided through choke C to the line. End 56 of transmission line 54 is shorted to ground, while the other end is connected to a switch S and then to another transmission line 58, herein shown as a coaxial line having its shield grounded. Control 60 is used to set the state of switch S. The switch can be another Josephson device, or a semiconductor type device. It is capable of two stable states and is used to control the buildup of waves in the cavity comprising the series connection of Josephson devices J1–JN.

If switch S is in its high voltage state, it will exhibit a high impedance so that waves propagating along line 54 will be reflected and will build up in amplitude. When switch S is put into its low voltage state (and hence low impedance state) by a signal from control 60, power can be delivered from the series array to the output transmission line 58. Thus, switch S operates as a Q switch does in other forms of laser and microwave structures where the Q of the cavity is changed in order to transfer power out of the cavity.

The embodiment of FIG. 8 is similar to that of FIG. 7, and for this reason the same reference numerals are used. Here, S is a resistor rather than a switchable device, such as a Josephson device. In the operation of the circuit of FIG. 8, use of the resistor instead of a switch allows some power to be left in the cavity comprising the transmission line and series connected Josephson devices in order to keep the output of the Josephson devices coherent with one another. Oscillations will build up in the transmission line cavity comprising the series array, but some energy will be delivered continuously to the output transmission line 58. Thus, the use of this resistor is similar to the use of a half silvered mirror in laser or maser amplifiers.

These arrays can be used to provide non-linear parametric amplification, harmonic generation, and frequency conversion when the junctions are biased below their critical currents. When biased below their critical current $i_0$, the junctions are in their zero voltage states and will not oscillate to produce electromagnetic waves. They will be non-linear inductors in the transmission line and can be used to provide parametric amplification of electromagnetic waves introduced into line 54, as by an antenna (FIG. 12) or by another transmission line connected to line 54 (for example, line 58 could be used to deliver an electromagnetic wave to line 54). Use of the arrays in this manner are similar to the use of other types of arrays for these applications. Because of the coherent properties of the array, however, improved operation results.

Since the equations which can be used to describe the series array are the same as those for non-linear optics devices, the same types of applications can be done with this array as are done in non-linear optics applications. When the Josephson devices are biased above their critical current, stimulated emission of radiation is obtained from them. In this case, each junction is an oscillator and not just a non-linear inductor as would be the situation when the Josephson devices are biased below their critical current. The array is then a collection of Josephson devices in their voltage states and if incident radiation falls upon the array, phase locking will occur between the Josephson devices and the incident radiation. The input radiation stimulates the Josephson devices to emit photons which are in step with the incident radiation. For instance, if an antenna is attached to one end of the series array, the (first) Josephson device nearest the antenna will radiate and provide an output which travels to the next (second) Josephson device, etc. The second Josephson device will have incident upon it not only the input radiation, but also the output from the first Josephson device. This will continue down the length of the array and power will be built up. If the transmission line array forms a cavity, certain modes can be reinforced and all of the Josephson devices can be stimulated at one time at a specific mode of the cavity. For example, if one end of the transmission line is shorted to ground while the other end is an open, a quarter wave resonator will be provided. The input radiation will then cause stimulated emission at a quarter wavelength. This will provide an oscillator in which energy is reflected back and forth in the cavity.

Since the Josephson devices may be separated by large distances and yet remain coherent, parametric or stimulated emission arrays will work at very high frequencies. These frequencies are limited to about 1 teraherz by the superconductive energy gap. The stimulated emission oscillator is tunable by means of selecting different cavity modes by adjusting the direct current $I_{DC}$ flowing into the array. Gross tuning is achieved by changing the cavity terminations in order to change the resonant modes of the cavity. Tuning is also achievable by parametrically varying the inductance or capacitance along the transmission line.

It should be noted that the device array of the present invention uses resonance phenomena when a cavity is provided, and in this manner the voltage across the entire array changes in steps corresponding to the mode which is excited. That is, the voltage across the array must correspond to a resonant frequency of the cavity. Tuning within each of the cavity modes is achieved to some degree by varying the amplitude of the DC current.

This is in contrast with the aforementioned array of Lukens et al, which is continuously voltage tunable. In Lukens' array, if the applied voltage changes the frequency must change also according to the Josephson relationship. There is no resonance phenomenon in that structure and no controlled coherence above about 30 GHz.

Antenna Array Driven by Coherent Junctions (FIG. 9)

In this embodiment, a transmission line 62 is comprised of two conductors 64 and 66 along which Josephson devices J1, J2, J3, . . . , J7 are connected. The coherent array of series connected Josephson devices J1–J7 comprises an oscillator which drives the antenna that is comprised of dipole conductors 68A, 68B, 70A, 70B, . . . , 82A, 82B. As is known in the art, the length of the dipoles is proportional to the frequency that is received or transmitted, the low frequency dipoles being the longer ones and the high frequency responsive dipoles being the shorter ones.

The antenna structure of FIG. 9 is a log-periodic array which can be used to deliver received incident radiation to the Josephson devices J1–J7, or to radiate power developed by oscillation of the array comprising the series connected Josephson devices.

Array Coupling

Figure 10:
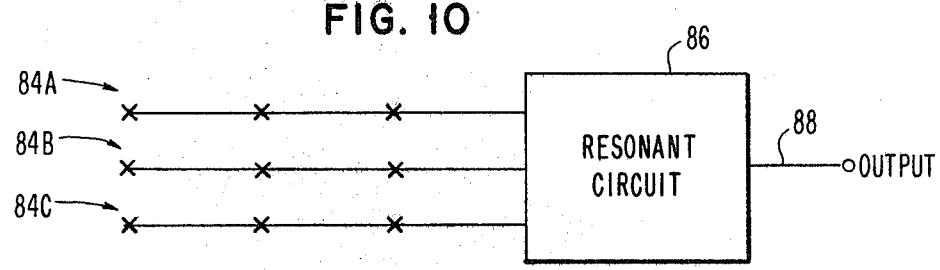
FIG. 10 schematically illustrates a plurality of series connected Josephson arrays coupled to a resonance circuit or transmission line, while FIG. 11 schematically represents a plurality of Josephson coherent arrays coupled together to a resonant cavity in order to provide increased output power.

The principles of this invention provide coherent series arrays for the development of increased power and amplification. These arrays can be coupled together to increase the power delivered to a load. For example, FIG. 10 illustrates a situation in which three arrays 84A, 84B, and 84C are coupled to a resonant circuit 86. The output of resonant circuit 86 is provided along a transmission line 88 in this diagram.

The resonant circuit 86 can be a circuit located on the same chip as the chip on which the arrays 84A–84C are located, or it could be a transmission line or external resonant circuit. Those of skill in the art understand that, once a series coherent array is provided, pluralities of arrays can be coupled together using conventional techniques.

Figure 11:
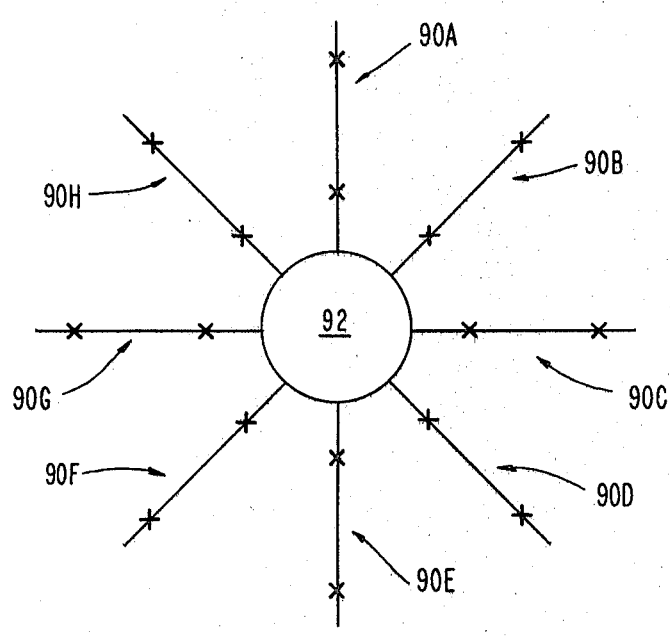

In FIG. 11, a plurality of coherent series arrays 90A, 90B, . . . , 90H are located around a resonant cavity 92. These arrays 90A–90H could be connected to antenna structures in the manner shown in FIG. 9, where the antennas shine into the cavity 92.

The structures of FIGS. 9 and 10 illustrate techniques for coupling a plurality of coherent series arrays to provide enhanced outputs. Other possible connections to do so will be apparent to those of skill in the art.

Figure 12:
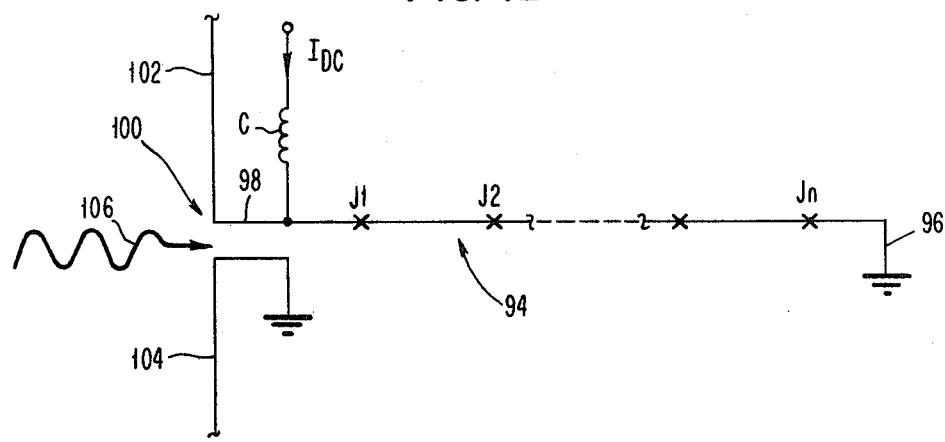
Figure 13:
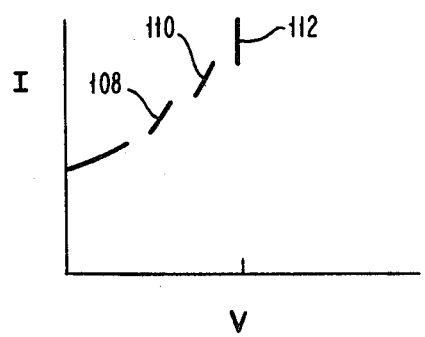
FIG. 13 is a current-voltage plot illustrating the use of the structure of FIG. 12 as a voltage standard.

Voltage Standard (FIGS. 12 and 13)

The coherent series array of the present invention can be used as a voltage standard. In this type of operation, a precise frequency microwave input is incident upon Josephson device arrays. Steps are produced in the current-voltage characteristic of the Josephson devices, where the steps have a precise relationship to the frequency of the incoming microwave radiation. In the prior art, the voltage developed across the Josephson devices has been very small and attempts have been made to increase the total output voltage by using series connected Josephson devices. In the prior art, it has been difficult to provide accurate coupling and phasing of the series connected Josephson devices, since coherency could not be achieved.

In the structure shown in FIG. 12, the phasing and coupling problems of the prior art have been solved, since coherent arrays of the type described herein are used. This means that the total output of the array will be the series addition of the voltages across the individual Josephson devices in the array, so that outputs in the range of volts can be obtained.

In more detail, series array 94 is comprised of the Josephson devices J1, J2, . . . , JN. In actural practice, many Josephson devices will be connected in series, such as approximately 1,000 such devices. Current $I_{DC}$ is fed from a direct current source through the choke C and into the array 94. One end (96) of the array is grounded, while the other end (98) is connected to a dipole antenna 100 having dipoles 102 and 104. Microwave radiation 106 is incident upon antenna 100 and is delivered to the input end 98 of array 94. Of course, it will be understood by those of skill in the art, that the microwave incident radiation could be directly coupled to array 94, as by the use of a transmission line connected to end 98 of the array. The microwave radiation has a precise frequency and is generally provided from a source such as an atomic clock.

FIG. 13 is a plot of the supplied current I versus total voltage V across the array. The curve illustrates several resonant steps 108, 110, and 112 which are related to mode locking of the array to the incident microwave power. Depending upon the cavity modes, different resonant steps will form. Steps 108 and 110 are self-resonant steps while step 112 is a driven step in which $dV/dI=0$. At step 112, the voltage V will be related to the frequency of the cavity and to the incident microwave frequency, and will be precisely determined.

As is apparent from the foregoing description, Josephson devices imbedded as series elements in a transmission line can act coherently via wave phenomena. Electromagnetic radiation can be incident on the array, or the combination of the direct current source and oscillations of the junctions can be used to establish the electromagnetic waves which provide coherence between junctions in the array.

Those of skill in the art will recognize that many techniques can be used to produce electromagnetic waves along the series array described herein, and that the properties of the transmission line can be varied to change the resonant modes provided by the array. Still further, the coherent array of this invention can be used for applications in which coherent generation and detection of high frequency waves is desired. While some applications have been described herein, it is apparent that other applications, such as astronomical amplifiers for farinfrared detectors and mixers could be provided, as well as a communications link in frequency-shift-keying generators, amplifiers and detectors. Still further, these coherent arrays are suitable to drive on-chip antenna arrays where the combination of the antenna array and coherent array would be fabricated on the same superconducting chip.

While the prior art cannot be used for high frequency traveling wave amplification and does not use any wave phenomenon, waves are used explicitly in the present invention so that the full range of non-linear effects such as harmonic generation, traveling wave amplification, and interferometric filtering is available for device design. These series arrays of Josephson devices can generate and support traveling or standing waves, or solitary waves, and in this manner distinguish over the art.

While the invention has been shown with respect to certain embodiments thereof, it will be further apparent to those of skill in the art that other designs and applications can be envisioned based on these principles.

Having thus described my invention, what I claim as new, and desire to secure by Letters Patent is:

1. A distributed array of Josephson devices, said array exhibiting coherence effects, comprising:
 a plurality of devices exhibiting Josephson currents therethrough and capable of having a zero voltage state and a non-zero voltage state, said devices being electrically connected in series along a waveguide type structure, each said device being coupled to all of the other Josephson devices by an electromagnetic wave,
 a waveguide type structure connecting said devices in series, said waveguide structure being capable of controllably supporting and sustaining electromagnetic waves along its entire length, said waves being coupled to each of said devices,
 a source of current through said devices in said series array for biasing said devices, and
 means for producing said electromagnetic wave along the entire length of said waveguide type structure.

2. The array of claim 1, where said waveguide structure is a transmission line having a defined characteristic impedance and propagation constant.

3. The array of claim 2, where said transmission line is a coaxial line.

4. The array of claim 2, where said transmission line is comprised of a strip line conductor.

5. The array of claim 1, where said waveguide structure is terminated at one end thereof in its characteristic impedance.

6. The array of claim 1, where said waveguide structure is terminated in a mismatch causing reflection of electromagnetic waves therefrom.

7. The array of claim 1, where said Josephson devices are tunnel junctions.

8. The array of claim 1, where said Josephson devices are biased in their non-zero voltage states.

9. The array of claim 1, where said Josephson devices are biased in their zero voltage states and where said means for producing an electromagnetic wave is an external means for delivering said wave to said distributed array.

10. The array of claim 1, further including a resonant cavity arranged to receive the output of said distributed array.

11. The array of claim 1, where said means for producing said wave includes means for providing radiation incident on said distributed array.

12. The array of claim 1, wherein said array is terminated at both ends thereof to form a resonant cavity for electromagnetic waves traveling therealong, and further including means for controllably removing power from said cavity.

13. The array of claim 1, where said Josephson devices are separated from one another by distances not in excess of the wavelength of said electromagnetic waves.

14. The array of claim 1, where said means for creating said electromagnetic wave includes said Josephson devices.

15. A method for obtaining coherence among a plurality of Josephson devices electrically connected in series, where each said Josephson device is characterized by a zero voltage state and a non-zero voltage state, including the steps of:
 sending a DC current through the series connection of said Josephson devices, and
 producing an electromagnetic wave coupled to all of said Josephson devices said wave being sustained over a time period sufficiently long that said wave couples to all of said devices a plurality of times to produce coupling between all of said Josephson devices.

16. The method of claim 15, including the further step of biasing said Josephson devices into their non-zero voltage states.

17. The method of claim 15, including the further step of biasing said Josephson devices into their zero voltage states.

18. The method of claim 15, including the further step of electrically terminating said series connection of Josephson devices to produce a cavity therealong.

19. A distributed array of Josephson devices, said array exhibiting coherence effects, comprising:
   a plurality of devices arranged electrically in series, said devices exhibiting Josephson currents therethrough and capable of having a zero voltage state and a non-zero voltage state,
   a transmission line structure connecting said Josephson devices in series, said transmission line structure being capable of controllably supporting electromagnetic waves therealong which are coupled to all of said devices and wherein said Josephson devices are spaced from one another by distances not in excess of the wavelength of said electromagnetic radiation, the total length of said array being much larger than said wavelength,
   means for sending electrical current through said Josephson devices in said array,
   means for creating said electromagnetic wave which propagates along the entire length of said transmission line structure and
   means for sustaining said wave in said transmission line structure for producing coherent coupling between all of said Josephson devices via said wave.

20. The array of claim 19, further including an antenna structure coupled to said distributed array.

21. The array of claim 19, where each of said Josephson devices has a resistor connected in parallel across it.

22. The array of claim 19, further including a resonant circuit into which the output of said distributed array is directed.

23. An apparatus for providing a voltage standard, said apparatus comprising in combination:
   a series array of devices electrically connected in series along a transmission line structure, said devices exhibiting a Josephson current therethrough and capable of having a zero voltage state and a non-zero voltage state,
   means for coupling input radiation of a precise frequency to said array of Josephson devices,
   means for providing a DC current through said series array of Josephson devices wherein the output voltage steps across said array occur at precise steps related to the frequency of said incoming radiation.

24. A distributed array of Josephson devices, said array exhibiting coherence effects, comprising:
   a plurality of Josephson devices arranged electrically in series along a transmission line capable of supporting electromagnetic waves therealong, said devices exhibiting Josephson currents therethrough and capable of having a zero voltage state and a non-zero voltage state,
   means for producing a current through said series connection of Josephson devices of a magnitude sufficient to bias all of said devices in their non-zero voltage states,
   cavity means for sustaining said electromagnetic wave along said transmission line so that said wave couples to all of said Josephson devices, all of said Josephson devices being coupled to one another through said wave and said array,
   means for extracting power from said array.

25. The array of claim 24, where said Josephson devices are separated from one another by distances greater than the Quasi-particle diffusion length in said transmission line, said array being characterized by the absence of shunting elements across pairs of said Josephson devices.

26. A distributed array of Josephson devices, said array exhibiting coherence effects and comprising:
   a plurality of Josephson devices arranged electrically in series along a waveguide type structure connecting said devices in series, each of said Josephson devices having a zero voltage state and a non-zero voltage state,
   means for producing a current through said series connection of Josephson devices,
   means for producing an electromagnetic wave along the entire length of said series connection of Josephson devices, said wave coupling to all of said Josephson devices and coupling said devices via said wave,
   means for sustaining said wave along said waveguide type structure in a manner that said wave traverses each of said Josephson devices a plurality of times.

27. The array of claim 26, where said electrical current through said Josephson devices exceeds the critical current of said devices, to place said devices in their non-zero voltage states.

28. The array of claim 26, where said Josephson devices are separated from one another by distances greater than the Quasi-particle diffusion length in said waveguide type structure, and said waveguide type structure is longer than the wavelength of said electromagnetic wave.

29. The array of claim 26, where said Josephson devices are separated by distances at least as great as the wavelength of said electromagnetic waves.

* * * * *